United States Patent [19]

Dorn et al.

[11] Patent Number: 4,628,514
[45] Date of Patent: Dec. 9, 1986

[54] MULTIMODE LASER

[75] Inventors: Reimund Dorn, Schwieberdingen; Martin Schneider, Stuttgart, both of Fed. Rep. of Germany

[73] Assignee: International Standard Electric Corporation, New York, N.Y.

[21] Appl. No.: 644,173

[22] Filed: Aug. 24, 1984

[30] Foreign Application Priority Data

Sep. 8, 1983 [DE] Fed. Rep. of Germany ....... 3332398

[51] Int. Cl.$^4$ .......................... H01S 3/045; H01S 3/19
[52] U.S. Cl. ...................... 372/36; 357/15; 357/17; 372/46
[58] Field of Search ...................... 372/46, 36; 357/15, 357/17, 81

[56] References Cited

U.S. PATENT DOCUMENTS 4,441,187  4/1984  Bouley et al. .................. 372/46

Primary Examiner—James W. Davie
Attorney, Agent, or Firm—John T. O'Halloran; Robert P. Seitter

[57] ABSTRACT

In a stripe-geometry multimode laser having a current-flow-determining stripe, only the flow of electric current is confined to a narrow area, while the heat can flow off through a large area. A window for the flow of electric current is formed by a narrow epitaxial semiconductor stripe which, because of its high doping level and of additionally diffused charge carriers, is highly conductively connected to both the underlying semiconductor and the overlying metal, while next to the stripe, electric conductivity from the semiconductor to the metal is very poor. The thermal conductivity, however, is approximately the same over the entire area.

3 Claims, 2 Drawing Figures

MULTIMODE LASER

BACKGROUND OF THE INVENTION

The present invention relates generally to lasers and more particularly to a multimode laser.

In optical fiber communication systems with bit rates up to about 200 Mb/s, graded-index fibers are preferably used. The light sources preferably employed in such systems are multimode lasers, because single-mode lasers, due to their long coherence lengths, tend to generate excess noise as a result of backscatter from the fiber. Such multimode lasers, particularly for the wavelength region around 850 nm, have been fabricated on the "V-groove principle". This principle has also been used for the wavelength region above 1000 nm. It requires a precisely controlled diffusion, which can only be achieved after costly experimentation.

Conventional oxide-stripe lasers with stripe widths ranging from 15 to 20 um cannot be used because they tend to cause changes in the near field and, thus, intensity variations in the current pulse. A way out was proposed by Dr. Renner and G. Henshall in February 1981 in the "IEEE Journal of Quantum Electronics", Vol. QE-17, pp. 199 to 202, namely to reduce the width of the stripe opened in the insulating oxide layer to a few micrometers. In this manner, stable multimode behavior is achieved, but thermal problems arise. As a result of the narrower contact area, the flow of current is concentrated. If the contact areas are less than 10 um wide, the threshold current of the laser increases with decreasing contact width. The higher threshold current and the more concentrated current flow result in more heat being produced during operation of the laser. The removal of this heat is obstructed by the narrower window in the oxide. Since the properties of semiconductor lasers are strongly temperature-dependent, the temperature rise resulting from the aforementioned disadvantages is undesirable.

SUMMARY OF THE INVENTION

Accordingly, it is an object of the invention to improve the removal of heat in a multimode laser of the above type.

According to the invention, this is achieved in that a narrow epitaxial contact stripe is provided, that the conductivity type of the contact stripe is the same as that of the capping layer, that the contact stripe is doped to a higher level than the capping layer, that the band gap in the contact stripe is smaller than that in the capping layer, that the doping level at the surface of the contact stripe is higher than that of the remainder of the contact stripe, that a Schottky contact layer covers the contact stripe and those portions of the capping layer not covered by the contact stripe, and that the Schottky contact layer is joined to a heat sink with solder.

The laser advantageously consists of materials of the InP/GaInAsP or GaAs/GaALAs semiconductor system. The Schottky contact layer is composed of titanium and gold, for example.

A multimode laser built in accordance with the invention has the added advantage that the window limiting the current flow at the side is closer to the active layer, so that current spreading is reduced.

BRIEF DESCRIPTION OF THE DRAWING

Above-mentioned and other features and objects of this invention will become more apparent by reference to the following description taken in conjunction with the accompanying drawings, in which.

DETAILED DESCRIPTION OF THE PREFERRED EMBODIMENT

Figure 1:
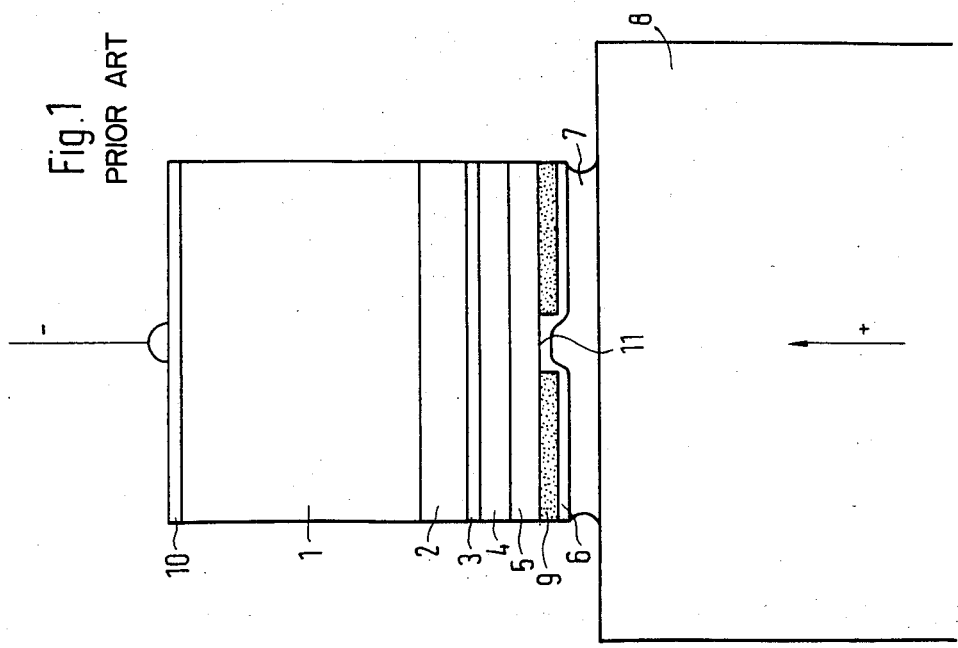
FIG. 1 is a cross-sectional view of a multimode laser of the prior art, the section plane being perpendicular to the direction of propagation.

First, a prior art multimode laser will be described with the aid of FIG. 1. On an n-type InP substrate 1, an n-type InP intermediate layer 2 is epitaxially deposited whose conductivity is higher than that of the substrate 1. The layer 2 is followed by a GaInAsP active layer 3, a p-type InP capping layer 4, and a p-type GaInAsP contact layer 5. These layers 3, 4, 5 are epitaxially deposited, too. They are followed by an insulating layer 9 of silicon oxide in which a stripelike window 11 has been left open. A Schottky contact layer 6 is deposited on the insulating layer 9 and is in contact with the contact layer 5 in the region of the window 11, while the remainder of the layer 6 is separated from the contact layer 5 by the insulating layer 9. The Schottky contact layer 6 is in electric and thermal contact with a heat sink 8 via a solder 7. A further contact layer 10, e.g., an AuSn layer, is deposited on the side of the substrate 1 opposite that supporting the intermediate layer 2.

The window 11 in the insulating layer 9 is dimensioned with regard to the flow of electric current. But the dissipated heat, too, can only flow off through this window. It would be desirable if this heat could flow off through a larger area.

Figure 2:
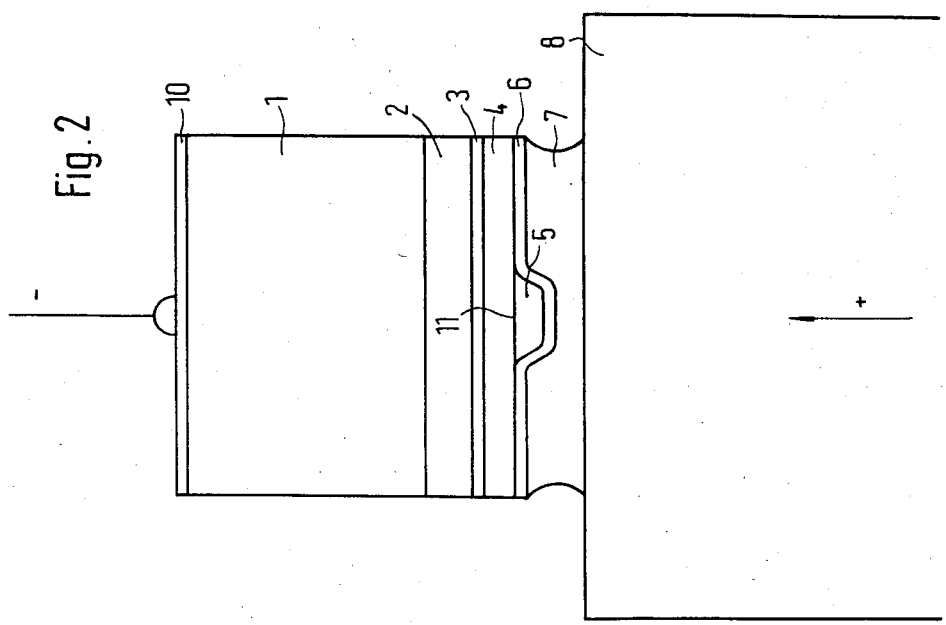
FIG. 2 is a corresponding cross-sectional view of a multimode laser in accordance with the invention.

That is the case in the multimode laser according to the invention, which is shown in FIG. 2 where the same reference numerals as before have been used to identify corresponding layers or elements. The structure of the laser as far as the contact layer 10, the substrate 1, the intermediate layer 2, the active layer 3, and the capping layer 4 are concerned, is largely identical to that in the prior art. The p-type GaInAsP epitaxial contact layer 5, however, has been etched away with the exception of a narrow stripe. The Schottky contact layer 6 is thus connected to the contact layer 5 through a stripelike area, but its remainder borders directly on the capping layer 4. The contact resistance between the contact layer 5 and the Schottky contact layer 6 is greatly reduced by a shallow zinc diffusion into the contact layer 5. This, in turn, creates a stripelike window 11 for the electric current, because the electric conductivity from the capping layer 4 via the contact layer 5 to the Schottky contact layer 6 is considerably better than that from the capping layer 4 directly to the Schottky contact layer 6. The thermal contact resistance in the region of the window 11, however, does not appreciably differ from that in the remaining region. The dissipated heat can thus be transferred through the entire width of the capping layer 4 to the Schottky contact layer 6 and, thus, through the solder 7 to the heat sink 8.

The window 11, which determines the electric current distribution, now lies closer to the active layer 3 and can, therefore, be wider than in the prior art. Thus, for a given current, the current density and, hence, the power dissipation decrease, so that the thermal properties of the multimode laser according to the invention are further improved.

Since the cappiing layer 4 is doped to a lower level, and has a larger energy gap, than the contact layer 5, and as a result of the additional zinc diffusion into the contact layer 5, electric contact between the capping layer 4 and the Schottky contact layer 6 in the region of the contact layer 5 is considerably better than in the remaining region. The same properties can also be achieved in multimode lasers fabricated from other materials, such as materials of the GaAs/GaAlAs semiconductor system.

While we have described above the principles of our invention in connection with specific apparatus, it is to be clearly understood that this description is made only by way of example and not as a limitation to the scope of our invention as set forth in the objects thereof and in the accompanying claims.

We claim:

1. Multimode laser comprising;
  a substrate;
  an epitaxial intermediate layer; an epitaxial active layer; an epitaxial capping layer, the conductivity type of the intermediate layer being the same as that of the substrate and opposite to that of the capping layer;
  a narrow epitaxial contact stripe of the same conductivity type as the capping layer, the contact stripe being doped to a higher level than the capping layer, the band gap in the contact stripe being smaller than that in the capping layer, and the doping level at the surface of the contact stripe being higher than that of the remainder of the contact stripe;
  a Schottky contact layer in direct contact with the contact stripe and those portions of the capping layer not covered by the contact stripe;
  a heat sink; and
  a solder body joining said Schottky contact layer to the heat sink.

2. A multimode laser as claimed in claim 1, wherein the laser consists of materials of the InP/GaInAsP semiconductor system.

3. A multimode laser as claimed in claim 1, wherein the laser consists of materials of the GaAs/GaAlAs semiconductor system.

* * * * *